(12) United States Patent
Gailus et al.

(10) Patent No.: US 7,071,775 B2
(45) Date of Patent: Jul. 4, 2006

(54) METHOD AND APPARATUS FOR AN ENHANCED EFFICIENCY POWER AMPLIFIER

(75) Inventors: Paul H. Gailus, Prospect Heights, IL (US); Lawrence F. Cygan, Schaumburg, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/872,748

(22) Filed: Jun. 21, 2004

(65) Prior Publication Data

US 2005/0280466 A1     Dec. 22, 2005

(51) Int. Cl.
*H03F 3/68* (2006.01)
(52) U.S. Cl. .................................. 330/124 R; 330/295
(58) Field of Classification Search ............ 330/124 R, 330/295, 286, 297
See application file for complete search history.

(56) References Cited

U.S. PATENT DOCUMENTS

| | | | |
|---|---|---|---|
| 2,210,028 A | | 8/1940 | Doherty |
| 2,282,714 A | | 5/1942 | Fagot |
| 5,646,631 A | * | 7/1997 | Arntz ......................... 342/373 |
| 5,786,727 A | | 7/1998 | Sigmon |
| 5,966,059 A | * | 10/1999 | Sigmon ...................... 333/128 |
| 6,133,788 A | | 10/2000 | Dent |
| 6,262,629 B1 | * | 7/2001 | Stengel et al. .......... 330/124 R |
| 6,369,651 B1 | * | 4/2002 | Dent ......................... 330/127 |
| 6,472,934 B1 | * | 10/2002 | Pehlke ....................... 330/10 |

FOREIGN PATENT DOCUMENTS

| WO | WO 2004/057755 A1 | 7/2004 |
|---|---|---|
| WO | WO 2005/031966 A1 | 4/2005 |

OTHER PUBLICATIONS

Frederick H. Raab, "Efficiency of Doherty RF-Power Amplifier Systems", Green Mountain Radio Research Company, Winooksi, Vermont, IEEE Transactions on Broadcasting, vol. BC-33, No. 3, Sep. 1987.

Frederick H. Raab, "Efficiency of Doherty RF-Power Amplifier Systems", Green Mountain Radio Research Company, Winooksi, Vermont, Aug. 4, 1984; Revised Jul. 12, 1985; Revised Oct. 8, 1985; Revision C 10 14, 1988.

(Continued)

*Primary Examiner*—Patricia Nguyen
(74) *Attorney, Agent, or Firm*—Valerie M. Davis

(57) ABSTRACT

A power amplifier that includes: an input drive controller (310) for receiving an input signal (312) and for generating from the input signal at least a first drive signal (314), a second drive signal (316), and a third drive signal (318); an outphasing amplifier network (320) coupled to the input drive controller that includes at least a first outphasing amplifier (322) for amplifying the first drive signal and a second outphasing amplifier (326) for amplifying the second drive signal; a peaking amplifier network (330) coupled to the input drive controller that includes at least a first peaking amplifier (332) for amplifying the third drive signal; and a combining network (340) coupled to the outphasing amplifier network and the peaking amplifier network for combining at least the amplified first, second and third drive signals to generate an output signal at a load.

18 Claims, 6 Drawing Sheets

300

OTHER PUBLICATIONS

Srirattana, et al., "A High Efficiency Multistage Doherty Power Amplifier for WCDMA", School of Electrical and Computer Engineering; Georgia Institute of Technology, Atlanta, GA, 0-7803-7829-6/03 2003 IEEEI.

Iwamoto, et al., "An Extended Doherty Amplifier with High Efficiency Over a Wide Power Range", Dept of Computer and Electrical Engineering, University of California at San Diego; La Jolla, CA, WE3A-6, 2001 IEEE MTT-S Digest.

Raab, et al., "RF and Microwave Power Amplifier and Transmitter Technologies—Part 3", High Frequency Electronics, Sep. 2003, Summit Technical Media, LLC.

* cited by examiner

METHOD AND APPARATUS FOR AN ENHANCED EFFICIENCY POWER AMPLIFIER

FIELD OF THE INVENTION

The present invention relates generally to power amplifiers and amplifying methods, and more specifically to high efficiency power amplifiers and related methods.

BACKGROUND OF THE INVENTION

Power amplifiers (PAs) are used in a wide variety of communications and other electronic applications. A major consideration in the design of power amplifiers is the efficiency thereof. It is generally desirable for linear power amplifiers to amplify radio frequency (RF) signals in a highly efficient manner. High efficiency is generally desirable so as to reduce battery drain in portable equipment, and the amount of power that is dissipated as heat. Linearity is generally desirable so that, for instance, the amplified signal contains no distortions and does not extend into adjacent frequency spectrum where it may cause interference with ongoing communications.

However, there are tradeoffs between maximum efficiency and high linearity. Specifically, efficiency is generally proportional to the input drive level, and high efficiency is usually not attained until an amplifier approaches its maximum output power, at which point the linearity is significantly degraded. Moreover, where the power amplifier is driven by an input signal having varying amplitude, a conventional class AB or B power amplifier, for example, must typically be operated at or near an average power level that is significantly below its saturation level to accommodate the peak input signal swings. As a result, the efficiency suffers.

One power amplifier technique that was developed as an enhanced efficiency amplifier used for amplifying an input signal with significant amplitude modulation is the Doherty PA architecture. The classical Doherty architecture combines two PAs of equal capacity through an impedance-inverter network that includes, for instance, one or more quarter-wavelength transmission lines. The carrier (or main) PA is, typically, biased in Class AB (but may be alternatively biased in Class B), while the peaking (or auxiliary) PA is typically biased in Class C. In operation, only the carrier PA is active when the input signal level is less than a predetermined threshold, for example when the input signal power is less than one fourth of the peak envelope power (PEP) for the Doherty PA. Both the carrier and peaking PAs contribute to output power when the input signal level is equal to or greater than the predetermined threshold.

FIG. 1 illustrates a plot of efficiency versus normalized power output of a classical Doherty PA architecture having a single carrier PA and a single peaking PA of equal capacity. As can be seen from FIG. 1, the Doherty amplifier exhibits an essentially flat efficiency versus power output characteristic over a 6 dB range from Pavg to PEP. This is possible due to the ability of the Doherty amplifier to dynamically adjust its load line in response to the driving signal envelope. However, there are a number of limitations associated with this architecture. For instance, in order to achieve desired linearity, the prior art Doherty PA must be designed to limit operation of its carrier amplifier to a level below saturation. This level usually corresponds to the carrier amplifier's 1 dB compression point, which may be 2 to 3 dB below saturation. Because of this limitation, maximum attainable efficiency is reduced to 80% or less of the efficiency value which is achievable at saturation.

Another limitation of the classical Doherty PA architecture is that above the peaking amplifier cut-in point, the carrier amplifier must simultaneously decrease its gain as its power output level increases. This action compensates for increases in carrier amplifier drive power that continue beyond the cut-in point of the peaking amplifier, and serves to maintain the desired constant voltage swing at the carrier amplifier output. More specifically, the carrier amplifier must be designed such that its gain decreases (by 3 dB) between Pavg (where the peaking amplifier is off) and PEP (where the peaking amplifier is fully on). This is done to fix the voltage swing at the output of the carrier amplifier while its load impedance is modulated by the peaking amplifier. The peaking amplifier drives current into the load, which raises its apparent impedance. However, because of the impedance inversion of the quarter-wavelength line attached to the carrier amplifier's output, the impedance at the carrier amplifier output drops, which occurs simultaneously with an increasing drive to the carrier amplifier. Therefore, without the above-referenced gain decrease, the power delivered by the carrier amplifier would increase by 6 dB at PEP, instead of the desired 3 dB. In such case, the linearity of the overall Doherty PA degrades, resulting in distortion of the amplified signal and spreading of the signal into the adjacent frequency spectrum. This represents one of the most significant design difficulties associated with practical Doherty power amplifier designs.

Yet another limitation of the classical Doherty PA architecture is that although it is effective for applications that have a peak-to-average ratio of about 6 dB (or about 4:1), its effectiveness is limited for applications such as, for instance, OFDM (orthogonal frequency division modulation), 4G cellular, WLAN, etc. that have increasingly higher peak-to-average ratios (e.g. 10–12 dB (or about 10–16:1)). In such applications, the modulated signal would spend considerable time at power levels below the range over which the classical Doherty PA exhibits maximum efficiency, resulting in significant degradations to the DC and RF conversion efficiency. In addition, many systems require additional (and often relatively large) reductions in the average power output during "power control" operations, further degrading the efficiency. Power control methods are commonly utilized to reduce the transmitter output level of portable or mobile units to the lowest level necessary to maintain reliable communications. Such power reductions minimize the level of interference, thereby maximizing the possible number of simultaneous users of the communications system. Unfortunately, the power reduction also causes an efficiency decrease in the power amplifiers used by these units.

An extended Doherty PA architecture may be utilized to more efficiently amplify applications having a higher peak-to-average ratio than 6 dB. One such extended Doherty topology includes additional peaking amplifier stages. FIG. 2 illustrates a plot of efficiency versus normalized power output of a prior art extended Doherty PA architecture having a single carrier amplifier stage and three combined peaking amplifier stages, all of equal capacity. As shown in FIG. 2, this configuration is usable over a 16:1 (12 dB) range of power output levels. However, the tradeoff is that the efficiency curve has a narrow peak in the vicinity of Pavg, and the efficiency dip between Pavg and PEP is very pronounced. This efficiency dip is the result of three peaking amplifier stages (or, alternatively, one peaking amplifier stage which is three times the size of the carrier amplifier stage) just beginning to turn on for drive levels incrementally above Pavg. In this region, current is drawn, but power output contribution from the peaking stage(s) is far below that of the carrier amplifier stage. Thus, efficiency first degrades then improves as the power output increases toward PEP.

In addition, although this extended Doherty topology addresses one limitation of the classical Doherty architecture, i.e., limited effectiveness for higher peak-to-average ratios, this extended Doherty architecture does not address the other two limitations of the classical Doherty architecture described above, i.e., maximum attainable efficiency being no more than 80% and the design difficulty of the carrier amplifier. Nor do other known extended Doherty topologies address these two limitations.

Thus, there exists a need for a power amplifier having high efficiency even when the average power level is backed off substantially from the amplifier's peak power capability and that maintains its efficiency over higher peak-to-average ratios.

BRIEF DESCRIPTION OF THE FIGURES

A preferred embodiment of the invention is now described, by way of example only, with reference to the accompanying figures in which.

DETAILED DESCRIPTION OF THE INVENTION

Figure 1:
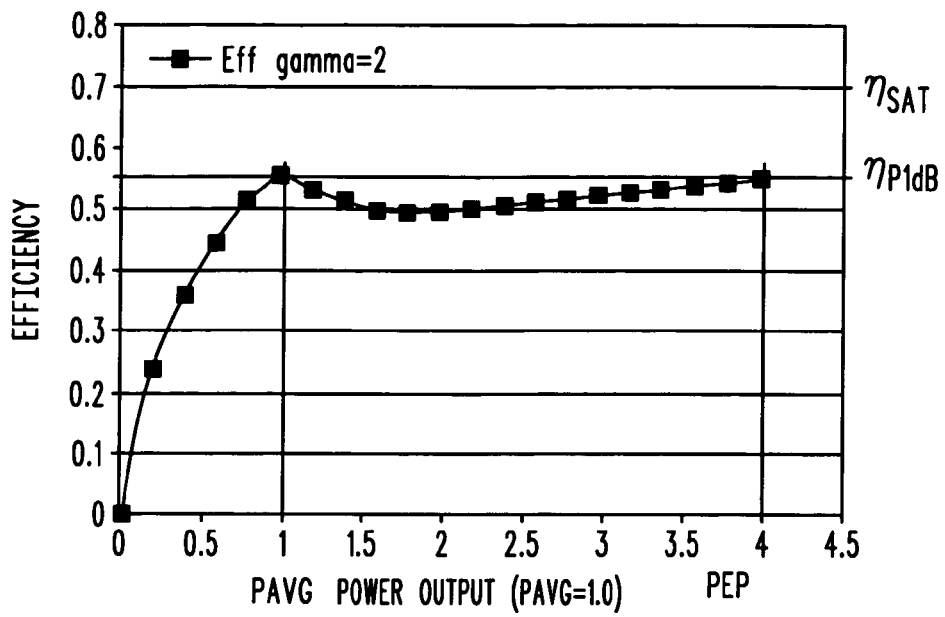
FIG. 1 illustrates a plot of efficiency versus normalized power output of a prior art classical Doherty PA architecture.
Figure 2:
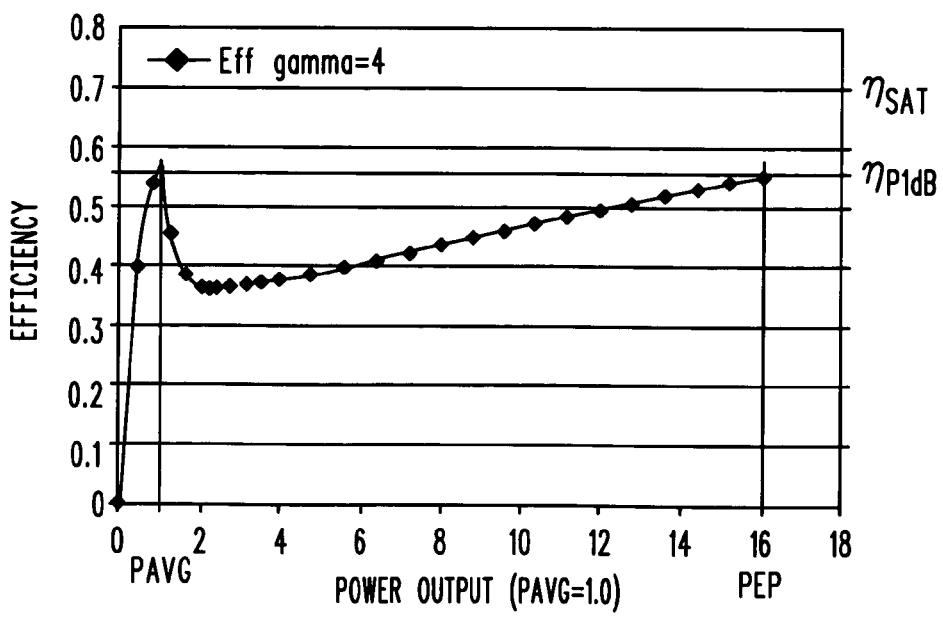
FIG. 2 illustrates a plot of efficiency versus normalized power output of a prior art extended Doherty PA architecture.

While this invention is susceptible of embodiments in many different forms, there are shown in the figures and will herein be described in detail specific embodiments, with the understanding that the present disclosure is to be considered as an example of the principles of the invention and not intended to limit the invention to the specific embodiments shown and described. Further, the terms and words used herein are not to be considered limiting, but rather merely descriptive. It will also be appreciated that for simplicity and clarity of illustration, elements shown in the figures have not necessarily been drawn to scale. For example, the dimensions of some of the elements are exaggerated relative to each other. Further, where considered appropriate, reference numerals have been repeated among the figures to indicate corresponding elements.

Figure 3:
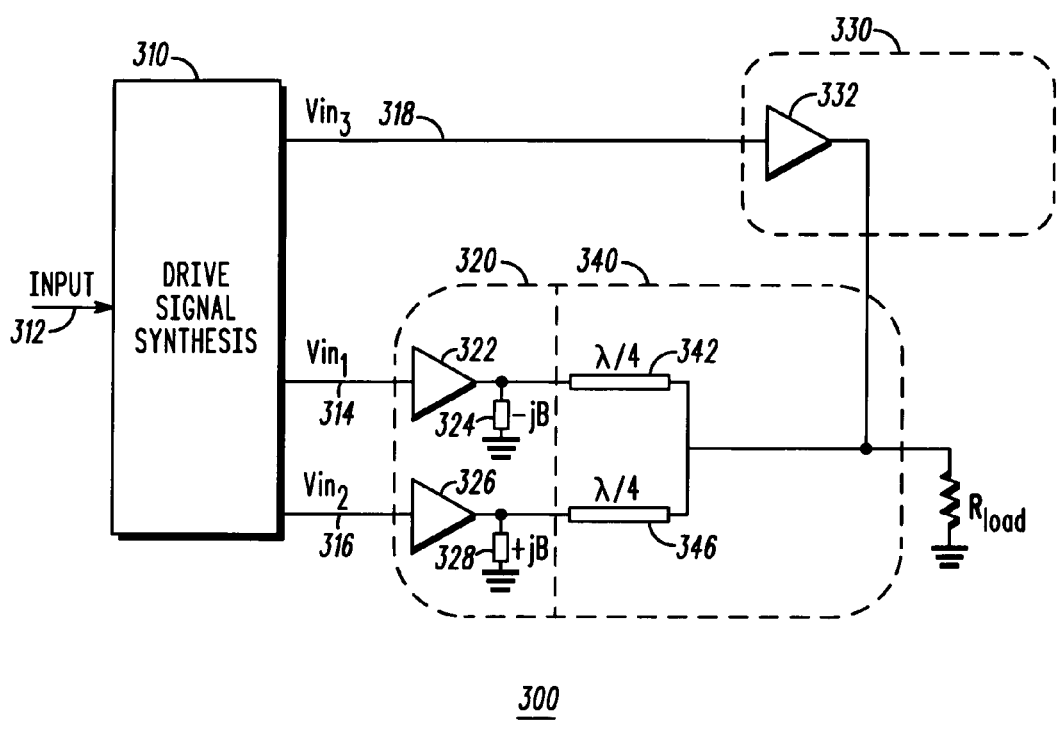
FIG. 3 illustrates a schematic diagram of a high-efficiency power amplifier architecture in accordance with an embodiment of the present invention.

FIG. 3 illustrates a schematic diagram of a high-efficiency PA architecture 300 in accordance with an embodiment of the present invention. PA 300 includes a drive signal synthesis (DSS) 310 (also referred to herein as an input drive controller). DSS 310 receives an input signal 312 and generates from the input signal at least three drive signals 314 (Vin1), 316 (Vin2) and 318 (Vin3). DSS 310 may include, in a typical embodiment, a conventional digital signal processor configured for sampling a modulated input signal and synthesizing from that input signal the requisite drive signals Vin1, Vin2 and Vin3. Input signal 312 may, for instance, contain both amplitude and phase modulation corresponding to the information to be transmitted. Drive signals 314, 316 and 318 will be described in more detail below.

PA 300 further includes an outphasing amplifier network 320 coupled to DSS 310 that includes outphasing amplifiers 322 and 326 that are used for amplifying, respectively, drive signals 314 and 316. Outphasing amplifiers 322 and 326 may be operated at or near saturation in a non-linear mode such as Class C or Class F, for maximum efficiency. Outphasing network 320 also, ideally, includes compensating shunt susceptances 324 and 328 coupled respectively to the outputs of amplifiers 322 and 326. In this case, the shunt susceptances are each further coupled to a ground potential. The shunt susceptances compensate for the reactive load impedances inherent in outphasing, thus enabling the outphasing amplifiers 322 and 326 to see resistive loads at selected phase angles of drive signals 314 and 316. With judicious choice of the shunt susceptances, the average efficiency of PA 300 can be optimized over a prescribed range of output power levels for any given input signal. Alternatively, combinations of shunt susceptances, series reactances and/or transmission line elements could be used for such compensation.

PA 300 also includes a peaking amplifier network 330 coupled to DSS 310 that includes a peaking amplifier 332 that is used for amplifying drive signal 318. Peaking amplifier 332 may be operated in a non-linear mode such as Class C or Class F for maximum efficiency. Finally, PA 300 includes a combining network 340 coupled to both the outphasing amplifier network 320 and the peaking amplifier network 330 for combining the amplified signals at the outputs of amplifiers 322, 326 and 332 and generating an output signal at a load $R_{load}$ that may be, for example, an antenna or another PA stage. In this instance, combining network 340 includes transmission lines 342 and 346 of substantially one quarter-wavelength coupled, respectively, between the outputs of amplifiers 322 and 326 and the output of amplifier 332. The quarter-wavelength lines function as impedance inverters to translate the output voltages of amplifiers 322 and 326 to corresponding currents. These currents are thereby readily combined with the output current from amplifier 332 at a common point coupled to the load $R_{load}$. Transmission lines 342 and 346 are nominally one quarter wave in electrical length, but may be foreshortened or lengthened to effectively absorb or compensate for any reactive loading present at the outputs of amplifiers 322 and 326. Alternatively, the transmission lines may be replaced by reactive element approximations to transmission lines or other networks having an electrical response equivalent to that of a transmission line.

The embodiment of the present power amplifier invention illustrated in FIG. 3 includes two outphasing amplifiers and one peaking amplifier. However, those of ordinary skill in the art will realize that the outphasing amplifier network could be extended to include additional outphasing amplifiers and, ideally, accompanying shunt susceptances or other equivalent compensation elements. Each additional outphasing amplifier may then be coupled to an associated quarter-wavelength line in the combining network. Such an approach may be used in outphasing architectures in which it is desired to further extend the range of efficient outphasing operation. Alternatively, an embodiment which constructs each of the outphasing stages through parallel operation of multiple smaller size devices to allow higher peak power output may be realized in this manner.

Those of ordinary skill in the art will further realize that the peaking amplifier network could, likewise, include additional peaking amplifiers engaging at multiple thresholds, for example, to extend the peak-to-average output power ratio supported. This embodiment of the peaking amplifier network may, for instance, have topologies such as those described above by reference to the extended Doherty architecture. Moreover, those of ordinary skill in the art will realize that in another embodiment of the present invention the combining network could include, for example, known hybrid or directional (non-hybrid) combiners for combining the signals at the outputs of amplifiers 322, 326 and 332. The architecture of these latter combining networks would, however, be more complicated to implement than the combining network described above that includes only the quarter-wavelength lines.

Figure 4:
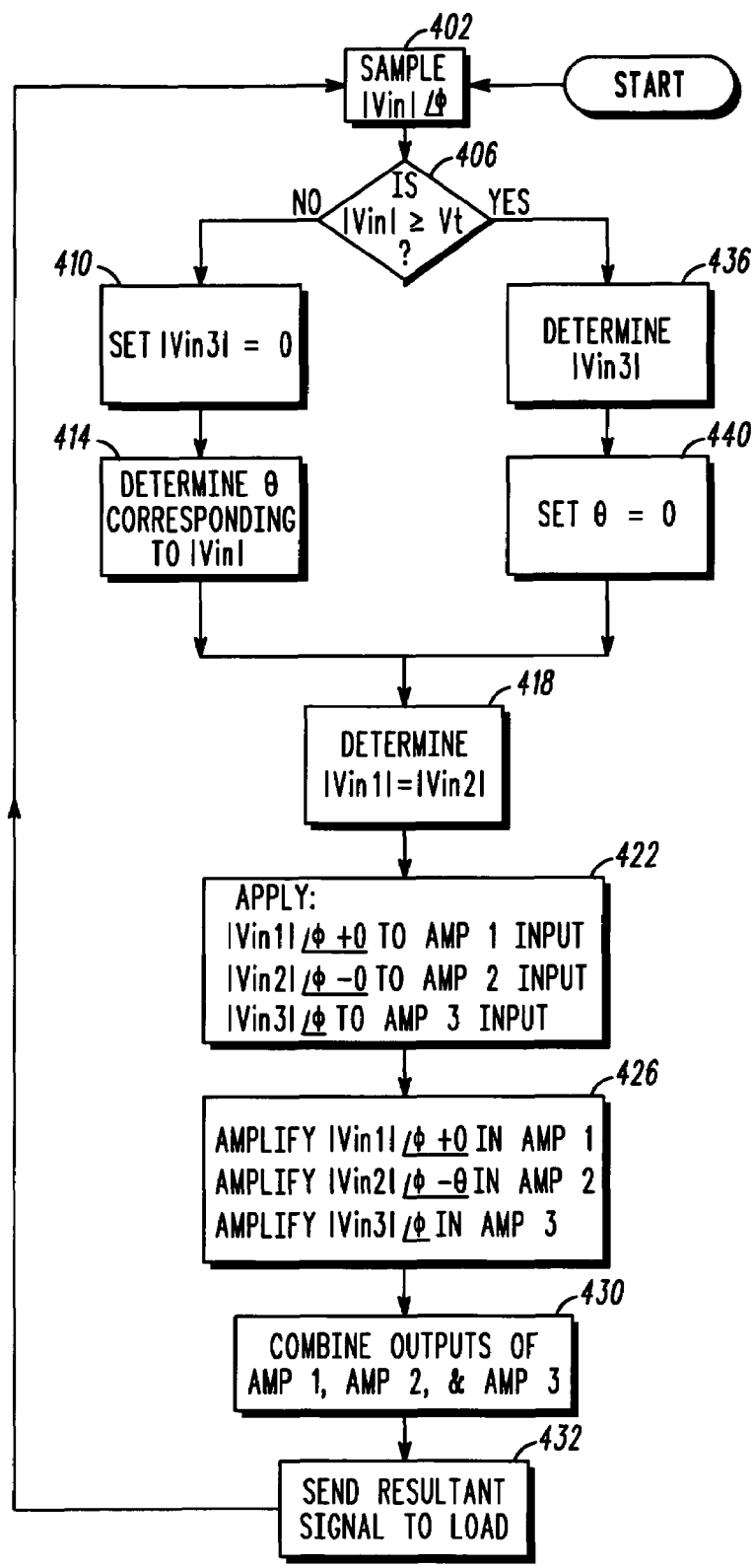
FIG. 4 illustrates a flow diagram of a method for amplifying an input signal in accordance with an embodiment of the present invention.

FIG. 4 illustrates a flow diagram of a method for amplifying an input signal in accordance with an embodiment of the present invention. FIG. 4 may, for instance, be implemented in PA 300 of FIG. 3 and will, thus, be described by reference to the operation of PA 300. The operation of a power amplifier in accordance with various embodiments of the present invention may be described, for the sake of simplicity, by reference to two regions, an outphasing region wherein only the amplifiers in the outphasing amplifier network are active and a load modulation region wherein amplifiers in both the outphasing amplifier network and the peaking amplifier network are active and contribute output power to the load. The transition point between the outphasing region and the load modulation region is a threshold Vt.

Turning to the steps of the flow diagram of FIG. 4, DSS 310 first samples (402) the input signal 312 (also referred to herein as Vin), which typically has an amplitude (e.g., |Vin|) and a phase angle (e.g., $\phi$). DSS 310 then compares (406) |Vin| to Vt. If |Vin| is less than Vt then PA 300 operates in the outphasing region. Otherwise PA 300 operates in the load modulation region. While in the outphasing region, DSS 310 generates drive signals Vin1, Vin2 and Vin3 from input signal 312, wherein Vin1, Vin2 and Vin3 each typically have an amplitude (e.g., respectively, |Vin1|, |Vin2| and |Vin3|) and a phase angle as described below.

As stated earlier, in the outphasing region only the outphasing amplifiers 322 and 326 are active. In this region, PA 300 generates an amplitude modulated output signal at the load by combining the two output signals of outphasing amplifiers 322 and 326. The output signals of outphasing amplifiers 322 and 326 are characterized as generally having substantially equal amplitudes, and (within the outphasing region) having different time varying phases, wherein the difference between the time varying phases of amplifiers 322 and 326 is a function of the amplitude of the input signal 312. The amplitude of the input signal 312 is used to determine this differential phase. Typically, half of the differential phase is added to the phase value of Vin to form Vin1, while the remaining half is subtracted from the phase value of Vin to form Vin2. More specifically, the inverse cosine of the input envelope (E) determines the +θ and −θ outphasing angle values of Vin1 and Vin2, respectively, to produce an output signal amplitude that is proportional to E, wherein DSS 310 could be configured for generating the inverse-cosine modulations of Vin1 and Vin2. Thus, the applied phase variation causes the instantaneous vector sum of the drive signals Vin1 and Vin2 for outphasing amplifiers 322 and 326 to follow the desired output signal amplitude. The absolute phase of input signal 312 corresponds to the value of $\phi$.

Figure 5:
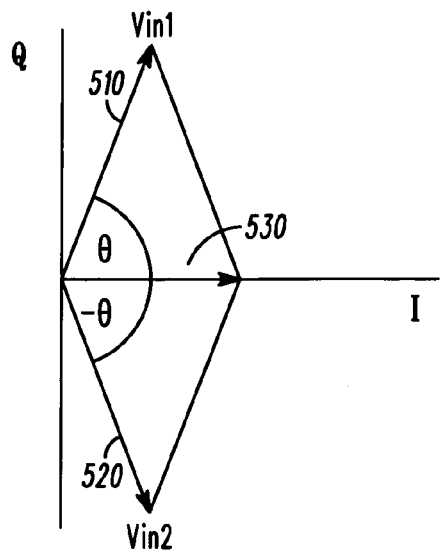
FIG. 5 illustrates the instantaneous vector sum of two outphasing drive signals using phase modulation in order to generate an output signal in accordance with an embodiment of the present invention.
Figure 6:
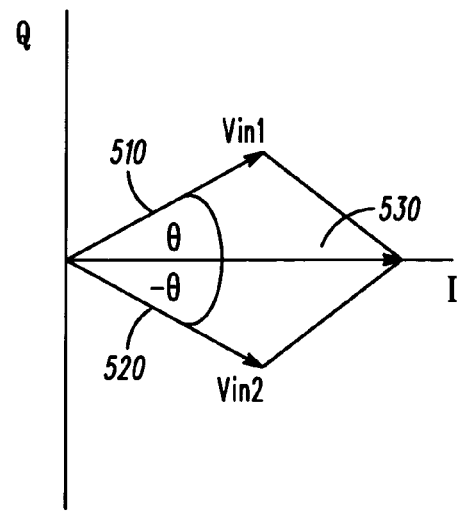
FIG. 6 illustrates the instantaneous vector sum of two outphasing drive signals using phase modulation in order to generate an output signal in accordance with an embodiment of the present invention.
Figure 7:
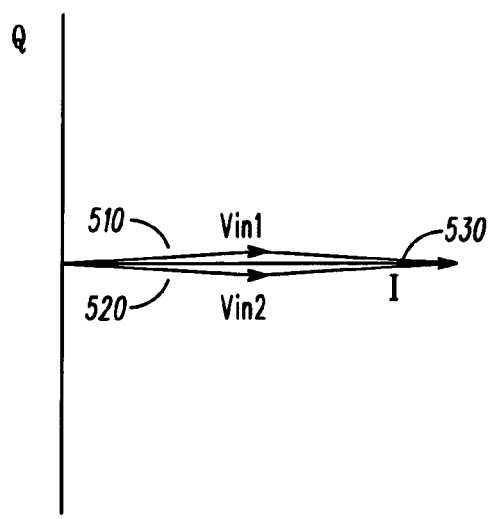
FIG. 7 illustrates the instantaneous vector sum of two outphasing drive signals using phase modulation in order to generate an output signal in accordance with an embodiment of the present invention.

FIGS. 5–7 illustrate the instantaneous vector sum of Vin1 and Vin2 using phase angle variations in order to generate a corresponding amplitude for the output signal, wherein the outphasing angle value θ decreases toward zero from FIG. 5 to FIG. 7. Illustrated in FIG. 5 is a vector 510 representing drive signal Vin1, a vector 520 representing drive signal Vin2 and a vector 530 representing the amplitude of the output signal to the load. As can be seen, vectors 510 and 520 have amplitudes that are substantially equal. However, their phase angles differ as a function of the value of the outphasing angle θ, such that their in-phase components determine the magnitude of vector 530. In FIG. 5, the outphasing angle θ is close to 90 degrees corresponding to smaller input signal amplitudes, and thereby used for generating smaller output signal amplitudes.

In FIG. 6, the outphasing angle θ is smaller than that shown in FIG. 5, resulting in a corresponding larger output signal amplitude vector 530. In FIG. 7, the outphasing angle θ is approaching zero degrees resulting in the largest of the three illustrated output signal amplitude vectors. PA 300 will operate in the outphasing region until the input signal results in vectors 510 and 520 being in phase (i.e., typically a corresponding outphasing angle of zero degrees), which corresponds to Vt and to the maximum output power that can be generated by the amplifiers 322 and 326 prior to the turn-on point of peaking amplifier 332. The outphasing angle can also be made to approach a constant value that is non-zero as |Vin| increases toward Vt at the upper end of the outphasing region. This provides the ability to make fine adjustments to the output power generated by amplifiers 322 and 326 at |Vin|=Vt.

It should be noted that in FIGS. 5–7, the phase angle of Vin1 is shown as +θ, and the phase angle of Vin2 is shown as −θ. However, those of ordinary skill in the art will realize that in general the phase angle of Vin1 is substantially equal to $\Phi$ (the phase angle of the input signal 312) plus at least a portion of the outphasing angle θ, and the phase angle of Vin2 is substantially equal to $\Phi$ minus at least a portion the outphasing angle θ, which would shift the vectors 510 through 530 by $\Phi$ degrees. However, for ease of illustrating the resulting amplitude of the output signal at the load, $\Phi$ is zero degrees, such that the phase angle of Vin1 is substantially equal to +θ (, i.e., 0+θ) degrees, and the phase angle of Vin2 is substantially equal to −θ (, i.e., 0−θ) degrees. Moreover, additional phase shifts may be incurred in the process of amplification of drive signals Vin1 and Vin2 by stages 322 and 326, respectively. The additional phase shifts should ideally be accounted for to allow compensation by DSS 310 in establishing the desired output signal amplitude vector 530. In the ideal case, these phase shifts are identically zero. However, in the non-ideal case a phase offset may be added or subtracted to Vin1 or Vin2 by DSS 310 to correct this behavior in practical amplifier stages.

Turning again to the flow diagram of FIG. 4, within the outphasing region wherein |Vin| is less than Vt, DSS 310 causes amplifier 332 to be in an off state by setting |Vin3| to be less than the turn-on threshold of amplifier 332, for instance, by setting |Vin3| to be substantially equal to zero (410). This causes the amplitude of the amplified Vin3 signal to be substantially equal to zero. DSS 310 then determines an outphasing angle (e.g., $\theta$) (414) that corresponds to |Vin|. DSS further typically determines a maximum amplitude value, e.g., $V_{in1, 2max}$, for maximum efficiency of PA 300 and sets |Vin1|=|Vin2| substantially equal to $V_{in1, 2max}$ (418). DSS 310 then applies (422) the determined and generated input drive signals Vin1, Vin2 and Vin3, respectively, to amplifiers 322, 326 and 332. These amplifiers then amplify (426) their corresponding drive signals The combining network 340 combines (430) the amplified signals into an output signal, which is delivered (432) to the load. The process then returns to step 402 with DSS 310 sampling the input signal 312.

In the embodiment of the present invention described above, the amplitude of the output signal for |Vin| less than Vt is achieved using only the phase angle variation of Vin1 and Vin2. In this case, two signals (Vin1 and Vin2) of substantially equal amplitude and having a constant envelope (i.e., $|Vin1|=|Vin2|=V_{in1, 2max}$) are combined to generate the output signal. However, in another embodiment of the present invention, the output signal in the outphasing region may, alternatively, be generated using a combination of amplitude variation and phase angle variation, particularly within the lower range of signal power levels (e.g., wherein $\theta$ is greater than a predetermined value), using known techniques. Thus, at step 418 DSS 310 would determine |Vin1|=|Vin2| to be substantially equal to a value that is based upon the value of $\theta$.

In this latter embodiment, the application of reduced input signal quantities facilitates the vector construction of a resultant signal 530 having a small magnitude, such as is the case when $\theta$ approaches 90 degrees and the vectors 510 and 520 nearly cancel. The generation of a small value resultant vector from large-value constituent vectors requires precise control of their amplitude and phase quantities, since the accuracy of the required cancellation is sensitive to small errors in these quantities. Alternatively, a small resultant vector may be constructed from two vectors of reduced magnitude, wherein small errors in the magnitude matching or phase control of the constituent vectors are easily tolerated.

Returning again to the flow diagram of FIG. 4, If |Vin| is greater than or equal to Vt, then PA 300 operates in the load modulation region. While in this region, DSS 310 generates drive signals Vin1, Vin2 and Vin3 from input signal 312, wherein Vin1, Vin2 and Vin3 each typically have an amplitude (e.g., respectively, |Vin1|, |Vin2| and |Vin3|) and a phase angle as described below. More specifically, in the load modulation region DSS 310 causes the peaking amplifier to be turned on and to source power in addition to the outphasing amplifiers by determining (436) |Vin3| based upon |Vin| and upon a desired output power. The phase angle of Vin3 is typically maintained substantially equal to the phase of the input signal. However, DSS 310 may also determine a phase shift to be applied to Vin3 in order to compensate for conditions such as, for instance, signal delays through combining network 340 or delays through peaking amplifier 332. Within the load modulation region, the outphasing angle $\theta$ corresponding to drive signals Vin1 and Vin2 is maintained substantially at the constant value described above for |Vin|=Vt (440). This constant value may be zero, wherein $\theta$=0 degrees. Small deviations from this constant value may be applied to the outphasing amplifier to correct for non-ideal amplifier behavior. Moreover, outphasing amplifiers 322 and 326 preferably continue to be operated in saturation for maximum efficiency, wherein $|Vin1|=|Vin2|=V_{in1, 2max}$. The method in the load modulation region then continues with steps 418 through 432 as described above.

Figure 8:
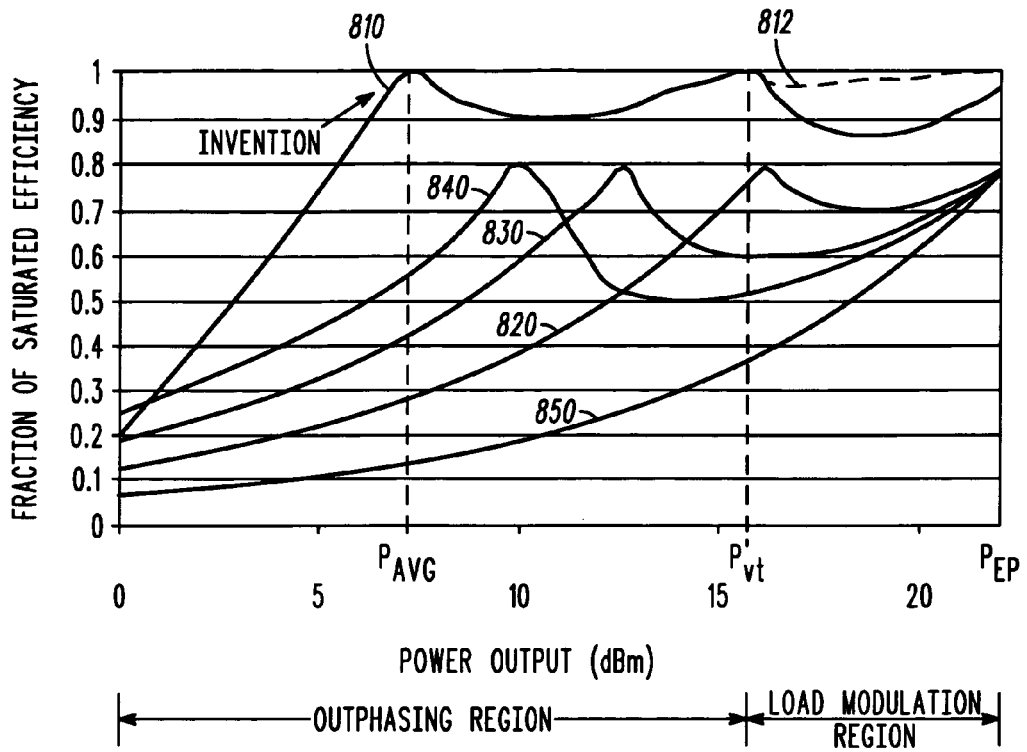
FIG. 8 illustrates a plot of efficiency versus normalized power output for an embodiment of a PA architecture of the present invention as compared to such plots for prior art PA architectures.

FIG. 8 illustrates a plot of efficiency versus power output for a power amplifier in accordance with the present invention (in this case PA 300), and for four prior art power amplifiers. Efficiency curve 810 is for PA 300. For reasons of comparison, efficiency curve 820 is for a classical prior art Doherty PA as described above. Efficiency curve 830 is for a prior art extended Doherty PA as described above, with two combined peaking amplifiers (or one peaking amplifier that is twice the size of the carrier amplifier). Efficiency curve 840 is for a prior art extended Doherty PA as described above, with three combined peaking amplifiers (or one peaking amplified that is three times the size of the carrier amplifier). Finally, efficiency curve 850 is for a prior art class AB power amplifier.

Curve 810 illustrates efficiency behavior of the present invention in both the outphasing region wherein power output is less than that produced for |Vin|=Vt and the load modulation region wherein power output is at least equal to that produced for |Vin|=Vt, wherein the power output at |Vin|=Vt is shown in FIG. 8 as $P_{Vt}$. Accordingly, for power output between Pavg and PEP, efficiency for PA 300 exceeds the prior art technologies as both the outphasing amplifiers 322 and 326, and the peaking amplifier 332 are operated at or near saturation. The slight dip in efficiency between Pavg and $P_{Vt}$ is generally caused by residual reactive load impedances, as discussed above, not being perfectly compensated for by the shunt susceptances. The relatively small dip in efficiency between the power output at |Vin|=Vt and PEP is due to the increasing drive causing the peaking amplifier to draw current before full voltage swing is achieved across the peaking amplifier output.

As can be seen from FIG. 8, one advantage of the present invention is that it maintains high efficiency over a larger power output range than any of the other prior art PA architectures to which it is being compared. This property enables highly efficient power amplification under conditions where the power output level might be decreased, such as during power control operations. Another advantage is that the absolute efficiency level attained by the present invention is significantly greater than for any of the prior art PA architectures. Specifically, the efficiency may exceed the 80% level to which the Doherty configurations are limited because of linearity constraints.

Yet another advantage of the present invention that is not evident from FIG. 8 but that is worthy of mention is that the present invention eases load-line modulation relative to prior art PAs, e.g. conventional Doherty PA architectures. As stated above, in the Doherty PA one of the more difficult design requirements is the need to correlate the carrier amplifier's gain to its load impedance once the peaking amplifier is turned on. However, this is not a design requirement in the present invention because the outphasing amplifiers have reached maximum saturated power output at the point when the peaking amplifier is turned on. Those of ordinary skill in the art will realize that the above-described advantages of the present invention are merely illustrative of such advantages and are, therefore, not meant to limit the scope of the present invention nor meant to be an exhaustive list of such advantages.

Figure 9:
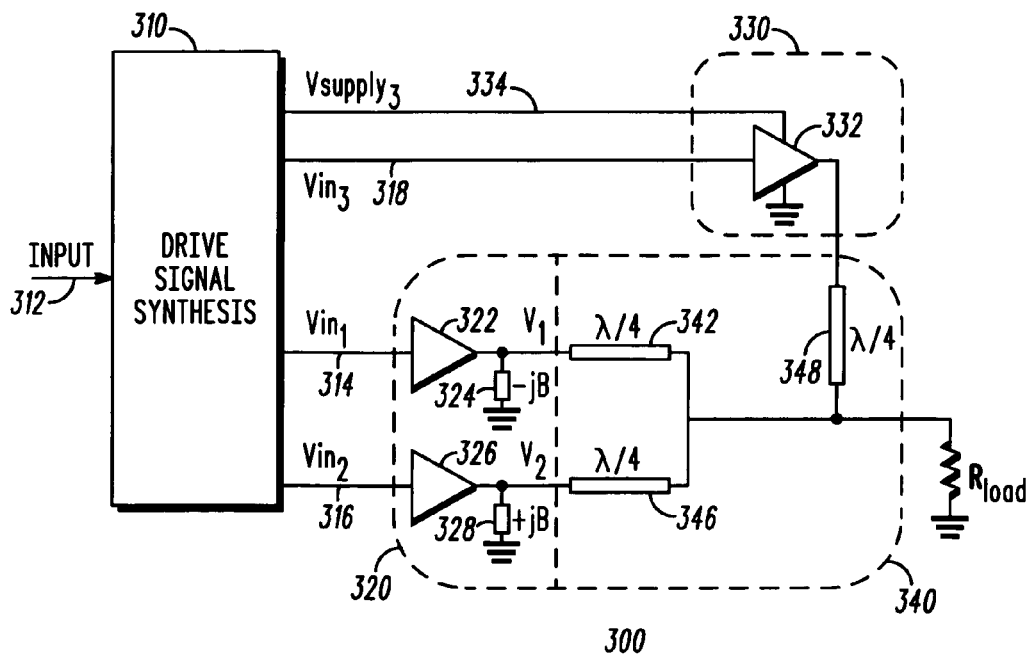
FIG. 9 illustrates a schematic diagram of a high-efficiency power amplifier architecture in accordance with another embodiment of the present invention.

Further improvement in efficiency may be realized by the addition of envelope tracking (supply modulation) techniques to the peaking amplifier of the present invention. FIG. 9 illustrates an embodiment of a power amplifier 300 in accordance with the present invention that implements supply modulation techniques to the peaking amplifier. PA 300 of FIG. 9 includes all of the elements of PA 300 of FIG. 3, which will not be discussed here for the sake of brevity. However, PA 300 of FIG. 9 also includes a voltage supply line 334 from DSS 310 to peaking amplifier 332. DSS 310 generates a supply voltage (e.g., Vsupply3) for peaking amplifier 332 on this line for implementation of supply modulation. Those skilled in the art will recognize advantages of alternative embodiments in which the extension of supply modulation to more than one peaking amplifier stage is made. For such embodiments, multiple supply lines such as 334 from DSS 310 may be included.

The combining network 340 of PA 300, ideally, further includes a transmission line 348 coupled between the output of amplifier 332 and the load for implementing supply modulation. The transmission line 348 is appended to the output of peaking amplifier 332 to insure that a high impedance is presented to the load when the peaking amplifier is turned off: i.e., when |Vin| is less than Vt. Specifically, the transmission line acts to rotate the off-state impedance presented by the peaking amplifier to a value much greater than that of the load. In so doing, power supplied by the outphasing amplifier is delivered almost entirely to the load, rather than partially to the load and partially to the peaking amplifier, as might be the case if the impedance rotation were not provided. This action serves to guarantee high efficiency operation of the outphasing amplifiers by making full use of the power which they generate. The electrical length of this line is subject to the specific peaking amplifier design, but is often determined to be approximately one quarter wavelength at the operating frequency of the power amplifier. Note that element 348 may introduce a phase shift in the signal path containing the peaking amplifier. Signal source DSS 310 may be required to apply a compensatory phase shift to Vin1 and Vin2 in order to align the signal phases of the outphasing amplifiers and peaking amplifier which are delivered to the load. Further note that the off-state impedance rotation as described for the second embodiment of FIG. 9 may, in fact, be utilized by the previous embodiment 300 of FIG. 3 in a similar manner to provide a high impedance to the load when the peaking amplifier 332 is turned off. As with the second embodiment, DSS 310 may be required to supply a compensatory phase shift to effect alignment of the signal phases of the outphasing and peaking amplifiers at the load.

Portion 812 of the efficiency curve 810 shows the improvement in the efficiency for PA 300 when supply modulation is utilized. As can be seen, efficiency remains relatively close to 100% from |Vin|=Vt (when the peaking amplifier turns on) to PEP.

Figure 10:
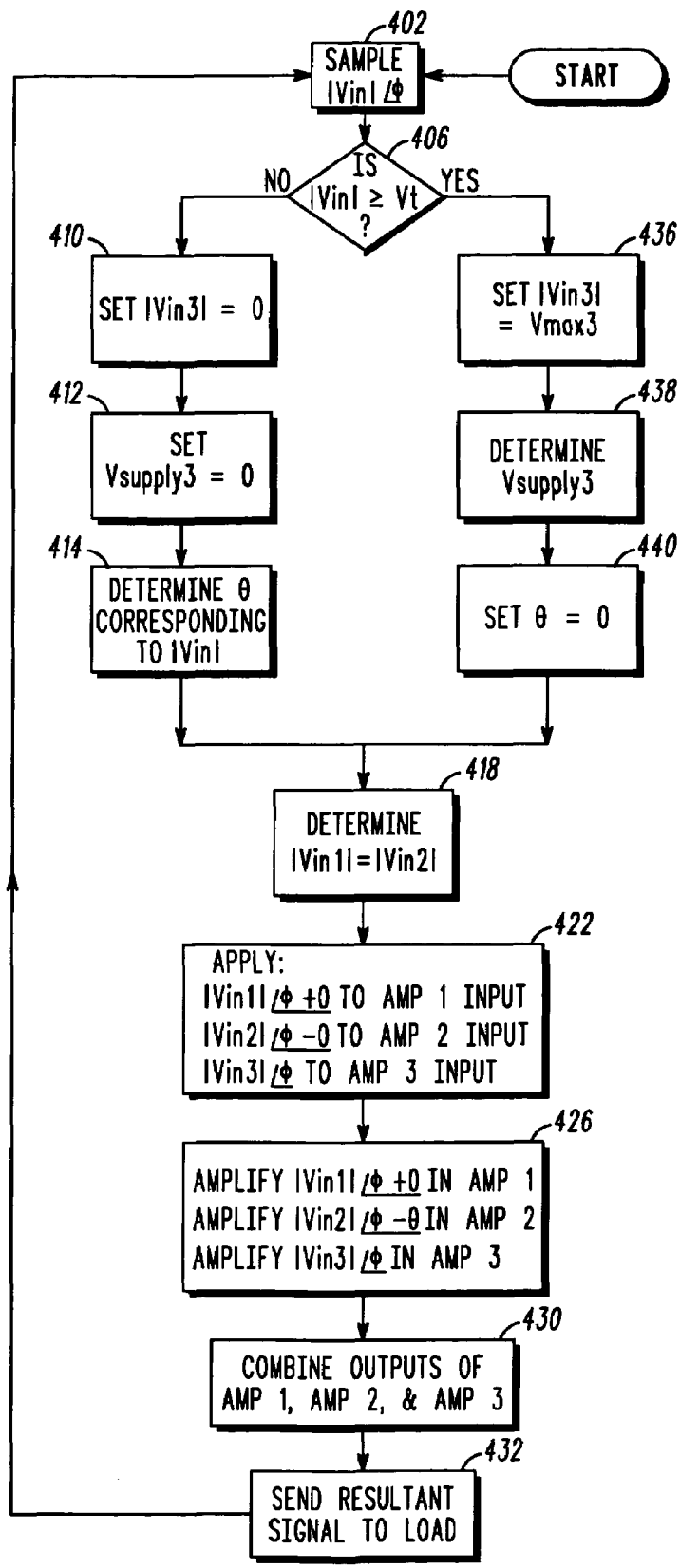
FIG. 10 illustrates a flow diagram of a method for amplifying an input signal in accordance with an embodiment of the present invention that uses supply modulation.

FIG. 10 illustrates a flow diagram of a method for amplifying an input signal in accordance with an embodiment of the present invention. FIG. 10 may, for instance, be implemented in PA 300 of FIG. 9 and will, thus, be described by reference to the operation of this power amplifier. The flow diagram of FIG. 10 includes all of the steps of the flow diagram of FIG. 4, which will not be repeated here for the sake of brevity. The flow diagram of FIG. 10, however, contains the additional steps of 412 corresponding to the outphasing region and the additional step of 436 corresponding to the load modulation region.

More specifically, since DSS 310 causes the peaking amplifier to be in an off state during the outphasing region, DSS 310 must correspondingly determine and set (412) the voltage supply Vsupply3 to the peaking amplifier to a value that is consistent with amplifier 332 being turned off. For example, DSS 310 might set Vsupply3 to be essentially zero volts. Conversely, while in the load modulation region, DSS can determine and set |Vin3| (436) to be a maximum value (e.g., Vmax3) that almost immediately saturates the peaking amplifier and then determine (438) Vsupply3 based upon the desired power output.

The use of envelope tracking with conventional linear power amplifiers is limited by linearity degradation resulting from the time-varying supply modulation which attempts to follow the RF signal envelope. Practical supply modulation, thus, implies the need for linearization means such as predistortion, feedback, feedforward, etc. However, in the present invention, application of supply modulation is made to the peaking amplifier device, which is intentionally operated in a non-linear mode such as Class C. Degradation of power amplifier linearity is minimal owing to the transient nature of the peaking amplifier contributions to the overall output.

While the invention has been described in conjunction with specific embodiments thereof, additional advantages and modifications will readily occur to those skilled in the art. The invention, in its broader aspects, is therefore not limited to the specific details, representative apparatus, and illustrative examples shown and described. Various alterations, modifications and variations will be apparent to those skilled in the art in light of the foregoing description. Thus, it should be understood that the invention is not limited by the foregoing description, but embraces all such alterations, modifications and variations in accordance with the spirit and scope of the appended claims. Moreover, those of ordinary skill in the art will further realize that while exact amplitude and phase values are desirable for optimal operation of the present invention, acceptable performance may be attained using magnitude and phase values substantially equal to the exact values, the accuracy of which is determined by the limitations of practical physical implementations.

What is claimed is:

1. A power amplifier comprising:
    an input drive controller for receiving an input signal and for generating from the input signal at least a first drive signal, a second drive signal, and a third drive signal, wherein the input drive controller includes a digital signal processor;
    an outphasing amplifier network coupled to the input drive controller comprising at least:
        a first outphasing amplifier for amplifying the first drive signal; and
        a second outphasing amplifier for amplifying the second drive signal;
    a peaking amplifier network coupled to the input drive controller comprising at least a first peaking amplifier for amplifying the third drive signal; and
    a combining network coupled to the outphasing amplifier network and the peaking amplifier network for combining at least the amplified first, second and third drive signals to generate an output signal.

2. The power amplifier of claim 1, wherein the combining network includes an impedance transforming network coupled to the first and second outphasing amplifiers and to the peaking amplifier network.

3. The power amplifier of claim 2, wherein the impedance transforming network includes a first substantially quarter-wavelength transmission line coupled between an output of the first outphasing amplifier and an output of the first peaking amplifier and a second substantially quarter-wavelength transmission line coupled between an output of the second outphasing amplifier and the output of the first peaking amplifier.

4. The power amplifier of claim 2, wherein the amplified third drive signal is a current and the amplified first and second drive signals are each voltages and wherein the impedance transforming network converts, the amplified first and second drive signals into currents to enable the amplified first, second and third drive signals to be combined.

5. The power amplifier of claim 1, wherein the outphasing network further comprises a first compensation element coupled to an output of the first outphasing amplifier and a second compensation element coupled to an output of the second outphasing amplifier.

6. The power amplifier of claim 5, wherein the first and second compensation elements may each be at least one of a shunt susceptance, a series reactance, and a transmission line element.

7. The power amplifier of claim 1 further comprising at least one voltage supply line coupled between the input drive controller and the peaking amplifier network, wherein the input drive controller further generates at least one supply voltage to the peaking amplifier network on the at least one voltage supply line.

8. A method for amplifying an input signal comprising the steps of:
sampling an input signal having an input amplitude and an input phase angle value;
comparing the input amplitude to a threshold value;
determining an outphasing angle value based on the input amplitude;
generating a first drive signal having a first amplitude and a first phase angle value that is substantially the input phase angle value plus at least a portion of the outphasing angle value;
generating a second drive signal having a second amplitude and a second phase angle value that is substantially the input phase angle value minus at least a portion of the outphasing angle value;
generating at least a third drive signal having a third amplitude and a third phase angle value;
amplifying the at least first, second and third drive signals; and
combining the amplified first, second and third drive signals to generate an output signal, wherein when the input amplitude is less than the threshold value the amplified third drive signal has substantially a zero amplitude, and wherein when the input amplitude is at least equal to the threshold value the outphasing angle value is substantially equal to a constant value.

9. The method of claim 8, wherein the constant value is zero degrees.

10. The method of claim 8, wherein when the input amplitude is at least equal to the threshold value the first, second and third phase angle values are substantially equal to the input phase angle value.

11. The method of claim 8, wherein the first, second and third phase angle values include the input phase angle value, and at least one of the first, second and third phase angle values include corresponding phase shifts.

12. The method of claim 8, wherein when the input amplitude is less than the threshold value, the third amplitude is substantially equal to zero.

13. The method of claim 8, wherein the first amplitude is substantially equal to the second amplitude.

14. The method of claim 13, wherein the first and second amplitudes are substantially equal to a maximum value.

15. The method of claim 13, wherein the first and second amplitudes are substantially equal to a value that is based on the outphasing angle value.

16. The method of claim 8 further comprising the steps of determining a supply voltage and generating a desired amplified third drive signal using the supply voltage.

17. The method of claim 16, wherein when the input amplitude is at least equal to the threshold value, the third amplitude is substantially equal to a maximum value.

18. The method of claim 16, wherein when the input amplitude is less than the threshold value the supply voltage is substantially equal to zero volts.

* * * * *